3,316,628
Patented May 2, 1967

3,316,628

BONDING OF SEMICONDUCTOR DEVICES TO SUBSTRATES

George F. Lang, Jr., Peabody, Mass., assignor to United Aircraft Corporation, East Hartford, Conn., a corporation of Delaware No Drawing. Filed Dec. 30, 1964, Ser. No. 422,404
8 Claims. (Cl. 29—472.7)

The present invention relates to a method for mounting a semiconductor device onto a header. More particularly, this invention is directed to a novel method for the bonding of silicon chips to ceramic substrates.

In order to improve both volumetric efficiency and upper operating temperature limits of silicon semiconductor devices, it has become standard practice to bond a plurality of such devices to the surface of a ceramic substrate. The plurality of devices, being individually unencapsulated, obviously require much less space. Additionally, the devices may be interconnected by short leads prior to encapsulation of the entire structure thus improving high frequency response. The use of a ceramic substrate such as alumina or beryllia, in view of the relatively high thermal conductivity of these materials, serves to efficiently conduct heat away from the junction areas of the active devices while simultaneously insulating them from one another.

State-of-the-art techniques for mounting silicon semiconductor devices to substrates involve the eutectic bonding of semiconductor devices such as mesa, planar, or epitaxial planar transistors and diodes to gold plated metal surfaces such as Kovar or gold plated metallized ceramics. Gold films readily adhere to metals such as nickel or Kovar, but gold does not readily adhere to glass or ceramics. For example, a pure gold film 50,000 angstroms thick which has been vacuum evaporated directly on an alumina ceramic may be removed merely by applying an adhesive tape over the film and thereafter removing the tape which takes the gold film along with it. On the other hand, whereas noble metal films such as gold and silver adhere to glass or ceramics poorly, oxide forming metals such as chromium and aluminum form a good bond with the surface of glass or ceramics. On this point, reference may be had to page 99 of the text, "Vacuum Deposition of Thin Films," by Holland, published by John Wiley & Sons, Inc., 1961. Therefore, in the prior art, when applying noble films to glass or ceramics, an undercoating such as a chromium film is used to improve the adherence of the noble metal films. This is somewhat comparable to metalizing a ceramic such as aluminum oxide with a molybdenum manganese formulation that is fired onto the ceramic at temperatures from 1200° C. to 1500° C. to obtain adherence. Thereafter, a metal film of electroless nickel is placed on the molybdenum manganese and the plating is followed by the deposition of a gold film. The semiconductor devices may then be bonded to the gold film.

Another prior art technique for the bonding of silicon semiconductor devices to ceramics, known as the Telefunken Process, involves the firing of molybdenum powder into a ceramic at 1500° C. As stated at page 167 of the text "Transistor Technology" volume III, edited by Biondi, and published by D. Van Nostrand Co., Inc. the adhering film of gold may be evaporated on molybdenum if the latter is held at 850° C. Temperatures higher or lower than this are unsatisfactory.

As may readily be seen from the foregoing, the prior art procedures of providing a gold film on a ceramic to which may be bonded a silicon semiconductor device are complicated and require undercoatings. An obvious disadvantage of employing an undercoating such as nickel or chromium is that these materials are known to reduce the oxidation resistance of a gold film by diffusing therethrough at elevated temperatures. On this point, reference may be had to the paper "Immersion Gold Plating of Semiconductor Materials," presented by G. I. Edson at the 1962 meeting of the Electrochemical Society. Since elevated temperatures are necessary for bonding of silicon to a gold film, the aforementioned diffusion renders such bonding difficult or impossible. In one example, a 50,000 angstrom gold film evaporated on alumina with an undercoating of chromium could not be wet by molten tin, let alone a silicon semiconductor, after the gold-chromium-alumina composite was subjected to 400° C. for a matter of minutes. However, if the gold was electroplated to a depth of 300 to 500 microinches, temperatures of 400 to 450° C. did not render the surface unwettable by silicon. This extra electroplating step is, however, undesirable for several reasons, the most obvious being the cost factor.

Most silicon semiconductor devices are required to withstand operating temperautres up to 300° C. Temperatures much above 300° C. for extended periods are damaging to the devices. It is known that gold melts at 1063° C. and silicon melts at 1404° C. However, a gold-silicon eutectic alloy melts at 377° C. It therefore becomes obvious that the gold-silicon eutectic alloy is an ideal bonding media for mounting semiconductor devices. This desirabillity is enhanced by the fact that the semiconductor-substrate contact may easily be made ohmic as opposed to rectifying in its properties. Accordingly, since the surface of the silicon to which the bond is made is very often one electrode of the device, if a minute amount of "p" or "n" type dopant is codeposited with the gold, an ohmic contact is assured.

It thus becomes an object of this invention to bond silicon to a ceramic.

It is also an object of this invention to provide an improved method of bonding semiconductor devices to a substrate.

It is another object of this invention to provide a novel method for affixing a silicon semiconductor device onto a substrate more rapidly and economically than previously possible.

These and other objects of the present invention are permitted by a unique bonding method whereby gold is evaporated on either the silicon semiconductor device or the ceramic substrate, the substrate and device are placed in contact and the composite is brought to an elevated temperature. The foregoing briefly outlined process results in the formation of a gold-silicon alloy which bonds the device to the ceramic.

In order to fully understand this novel bonding process, it must be remembered that gold and silicon form a good bond and, when the temperature is elevated, form a gold-silicon eutectic. Further, it has been recently discovered that silicon semiconductor material can be directly bonded to a ceramic wafer such as alumina, zirconia, silicon nitride and magnesia. Of course, in experimentation, these bonds between silicon and a ceramic have been achieved by means of electron beam melting of the silicon without using intermediate materials such as evaporated gold, titanium or tungsten. In other words, under the influence of a high intensity electron beam, it has been found that molten silicon brazes itself to a number of ceramics. Thus, it has been proved that a bonding mechanism exists between silicon and a number of ceramics. Accordingly, it may be seen that silicon semiconductors may be bonded to ceramics and glass by means of a gold-silicon alloy without use of materials known for their properties to adhere to ceramics and glasses intermediate to the gold and ceramic or glass. These bonds result from the fact that the deposited gold film forms a eutectic with the silicon which eutectic forms a tenacious bond with the ceramic. The bonds are formed at a low temperature not damaging to the semiconductors. Typically, this temperature will be 425° C., which is 50° C. above the gold-silicon eutectic melting point and well below the melting point of gold or silicon. The bonds are formed in two to five seconds with about twenty grams pressure and slight agitation, such as by a sixty-cycle buzzer.

It is also possible to prepare a gold-silicon eutectic composition which may be used to metalize glass or ceramics before bonding silicon devices thereto. This technique prevents excessive dissolution of the silicon device by gold when the p-n junctions of the device are very close to the surface being bonded. It is also possible to use the gold-silicon metalizing on glass or ceramics for nucleation on or as a base for growing silicon layers, epitaxially or otherwise, for light sensitive cells, solar cells or semi-conductor devices.

In practicing the novel bonding method which comprises this invention, the ceramic or substrates are first cleaned by being placed in 1% Alconox solution and being subjected to ultrasonic agitation followed by water and alcohol rinses. The silicon chips are cleaned by the same procedure plus being soaked for five minutes in a 48% hydrofluoric acid solution. Considering a case where the substrate was 96% alumina with a 64 micro-inch surface finish, 50,000 angstroms of gold was vacuum deposited directly thereon after cleaning. The adherence between the gold and ceramic was very poor. After placing the silicon chips on the gold film and heating the composite to 425° C. in air on a hot plate, the adherence of the chips to the substrate was 100%. This adherence is explained by the fact that a silicon-gold eutectic was formed which caused the silicon chips to become eutectically bonded to the ceramic. Bonding also can be achieved by raising the temperature of the composite to 300° C. and subjecting it to a jet of hydrogen gas at 450° C. The latter process has, in tests, achieved 80% adherence. After both of the foregoing processes, the gold film in the areas not covered by a silicon chip easily broke away from the ceramic at the completion of the process.

The foregoing process has also been used to successfully bond silicon chips to Pyrex glass. In this case it has been found most desirable to raise the temperature of the composite to 300° C. while impinging on a hot hydrogen jet at 450° C. thereon.

While a preferred embodiment has been shown and described, various modifications and substitutions may be made without deviating from the scope and spirit of this invention. Thus, this invention is described by way of illustration rather than limitation and accordingly it is understood that this invention is to be limited only by the appended claims taken in view of the prior art.

I claim:

1. A method for the bonding of silicon to a ceramic comprising:
depositing a gold film on a surface of a ceramic body,
placing a silicon chip on the deposited gold film, and
raising the temperature of the assembly to the extent necessary for the formation of a gold-silicon eutectic.

2. A method for the bonding of silicon to a ceramic comprising:
forming a gold film between the ceramic and a silicon body, and
raising the temperature of the composite such that a gold-silicon eutectic is formed.

3. A method of bonding a silicon semiconductor device to a ceramic substrate comprising:
depositing a gold film on a surface of the substrate,
positioning the silicon device on the deposited film, and
heating the combination to 425° C.

4. A method of bonding a silicon semiconductor device to a ceramic substrate comprising:
depositing a gold film on a surface of the substrate,
positioning the silicon device on the deposited film,
heating the combination to 300° C., and
impinging a jet of hydrogen gas at 450° C. on the combination.

5. A method of bonding a silicon chip to a substrate comprising:
cleaning the substrate by subjecting it to vibration in an alcohol solution,
depositing a gold film on a surface of the substrate,
vibrating the silicon chip in an alcohol solution,
removing the chip from the alcohol solution and placing it in a hydrofluoric acid solution,
removing the chip from the acid solution and placing it on the gold film,
raising the temperature of the combination to 425° C., and
simultaneously subjecting the combination to pressure and agitation.

6. A method of bonding a silicon chip to a substrate comprising:
cleaning the substrate,
cleaning the chip,
depositing gold on a surface of the substrate to a depth of 50,000 angstroms,
positioning the chip on the gold film,
heating the combination in air to 425° C.,
subjecting the combination to 20 grams pressure, and
vibrating the combination at a frequency of 60 c.p.s.

7. A method of bonding silicon to glass comprising:
depositing a gold film on the surface of the glass,
positioning a body of silicon on the gold film,
heating the combination to 425° C., and
simultaneously subjecting the heated combination to pressure and agitation.

8. A method of bonding a silicon chip to a ceramic substrate comprising:
vibrating a ceramic wafer in an alcohol solution,
vacuum depositing gold on a surface of the ceramic wafer to a depth of 50,000 angstroms,
vibrating the silicon chip in an alcohol solution,
removing the silicon chip from the alcohol solution and placing it in a 48% hydrofluoric acid solution for five minutes,
removing the silicon chip from the acid solution and positioning it on the deposited gold film,
exerting 20 gram pressure against the chip to force it into contact with the gold film,
heating the combination in air to 425° C., and
simultaneously causing slight relative movement between the chip and wafer.

References Cited by the Examiner

UNITED STATES PATENTS 3,128,545 4/1964 Cooper ____________ 29—472.7

JOHN F. CAMPBELL, *Primary Examiner*.

L. J. WESTFALL, *Assistant Examiner*.